(12) United States Patent
Plonka

(10) Patent No.: US 6,549,242 B1
(45) Date of Patent: Apr. 15, 2003

(54) COMBINING ADJACENT TV CHANNELS FOR TRANSMISSION BY A COMMON ANTENNA

(75) Inventor: Robert J. Plonka, Quincy, IL (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 09/024,320

(22) Filed: Feb. 17, 1998

Related U.S. Application Data

(60) Provisional application No. 60/042,932, filed on Apr. 4, 1997.

(51) Int. Cl.$^7$ ................................................. H04N 5/38
(52) U.S. Cl. ........................ 348/487; 348/21; 348/723
(58) Field of Search ........................ 348/723, 21, 724, 348/487; 370/297, 343; 333/134, 135, 202, 208, 211, 212; 342/55; H04N 5/38

(56) References Cited

U.S. PATENT DOCUMENTS

| | | | |
|---|---|---|---|
| 3,747,111 A | | 7/1973 | Fletcher et al. |
| 4,012,742 A | | 3/1977 | Dempsey |
| 5,291,290 A | | 3/1994 | Vaughan et al. |
| 5,327,245 A | * | 7/1994 | Unetich et al. ............. 348/723 |
| 5,943,012 A | * | 8/1999 | Sinclair ....................... 342/373 |

FOREIGN PATENT DOCUMENTS

| EP | 0552094 A1 | 7/1993 |
|---|---|---|
| EP | 0552094 | 7/1993 |
| GB | 2315603 A | 2/1998 |

OTHER PUBLICATIONS

European Search Report EP 98 10 5433.
"Testing of the Grand Alliance HDTV Transmission Subsystem", by Jules Cohen and Victor Tawil, pp. 266–273.
"The UOSAT v.h.f. and u.h.f. data beacons and antenna system", by R. W. Haining and A. K. Brown.
Transmitting VHF–TV Equipment, RCA New Look, pp. 122.
Testing of the Grand Alliance HDTV Transmission Subsystem, by Jules Cohen and Victor Tawil, SMPTE Journal, p. 266–273, May 1995.
"The UOSAT v.h.f. and u.h.f. data beacons and antenna system", by R.W. Haining, B.Sc.(Eng.),C. Eng., MIEE and A.K. Brown, B.Sc., The Radio and Electronic Engineer, vol. 52, No. 8 9 p. 403–406, Aug. Sep. 1982.

* cited by examiner

Primary Examiner—David E. Harvey
(74) Attorney, Agent, or Firm—Tarolli, Sundheim, Covell & Tummino L.L.P.

(57) ABSTRACT

Television signals from adjacent channels are broadcast with a common antenna. First television signals from a first channel are selected from a first frequency band including a plurality of channels. Second television signals from a second channel in the first frequency band are selected and wherein the second channel is adjacent to the first channel. The first and second signals are combined to provide a first combined signal and a second combined signal which are applied to a common antenna.

24 Claims, 5 Drawing Sheets

COMBINING ADJACENT TV CHANNELS FOR TRANSMISSION BY A COMMON ANTENNA

RELATED APPLICATION

This application claims the benefit of U.S. Provisional Application Serial No. 60/042,932, filed Apr. 4, 1997.

BACKGROUND AND FIELD OF THE INVENTION

The present invention relates to RF broadcasting and specifically to combining and transmitting adjacent television channels using a common antenna.

DESCRIPTION OF THE PRIOR ART

In the United States, the Federal Communications Commission (FCC) has established guidelines for broadcasting television signals. At present, the established standard is known as the NTSC signal format which may be broadcast in both the VHF and UHF TV frequency bands. The VHF band includes a low band from 54 MHz to 88 MHz and a high VHF TV band from 174 MHz to 216 MHz. The UHF TV band is from 470 MHz to 806 MHz. The NTSC signal is an analog signal.

The FCC has announced that high definition TV will be forthcoming. It is presently understood that digital television signals (DTV) as well as analog NTSC signals will be simultaneously broadcast for a transitionary period until approximately the year 2006, after which only DTV signals will be broadcast. During the transitionary period the various TV stations that presently broadcast NTSC signals will be allotted a second channel for broadcasting the DTV signals.

Heretofore the FCC has not assigned adjacent NTSC channels to the same location. However, with the need for additional channels for the duration of the transition period, a need arises that adjacent channels may be assigned to the same location wherein at least one channel is a DTV channel.

It will be economical for a station broadcasting both NTSC and DTV signals that the signals be transmitted from a common antenna. This will save the station a significant amount for the cost of erecting a tower (which may be on the order of 1,000 feet tall). A single tower with a common antenna for two or more channels will provide substantial savings.

It is known in the art to employ a common antenna for broadcasting television signals from two non-adjacent NTSC television channels, such as channels 4 and 6 (it is to be noted that channels 4 and 5 are spaced apart by 4 MHz and, hence, are not adjacent channels). For example, the NTSC television signals in channels 4 and 6 have been diplexed and transmitted by a common turnstile antenna in installations in Rochester, N.Y.; Dallas, Tex. and Mexico City as noted on page 122 of an RCA catalog entitled *VHF TV Transmitting Equipment*, copyright 1968.

It is understood that the FCC has not assigned adjacent NTSC channels to a common area. Generally it is believed that such television signals broadcast from adjacent channels would provide interference with one another. Specifically it is understood that the stronger or higher power channel would dominate the lowerpower channel resulting in artifacts or wavy lines at the receivers of the lower power television signals. In view of these concerns there has been no need thus far to broadcast NTSC signals at adjacent channels. However it is believed that with the advent of digital television there is a need presented to broadcast on adjacent channels, such as adjacent DTV channels or an NTSC channel adjacent to a DTV channel.

SUMMARY OF THE INVENTION

It is therefore an object of the present invention to provide for.simultaneous transmission of television signals from adjacent channels with a common antenna.

In accordance with one aspect of the present invention provision is made for transmitting television signals from adjacent channels with a common antenna by providing a source of first television signals from a first channel selected from a first frequency band that includes a plurality of channels. A source of second television signals is provided from a second channel in the first frequency band and wherein the second channel is adjacent to the first channel. The first and second television signals are combined to provide first and second combined signals which are then supplied to a common antenna for transmitting television signals.

In accordance with another aspect of the present invention a radio frequency coupler, such as a combiner, simultaneously couples television signals from a least two television broadcast transmitters for application to a single turnstile type antenna and wherein the television signals are from adjacent frequency channels. The coupler, in accordance with this aspect of the invention, includes a first input circuit for receiving television broadcast signals at a first television frequency from a first broadcast transmitter and a second input circuit for receiving television broadcast signals at a second television frequency channel from a second broadcast transmitter wherein the second channel is located in a television frequency spectrum adjacent to the first channel. A combiner simultaneously receives the broadcast signals from the first and second channels by way of the respective first and second input circuits for purposes of providing combined television broadcast signals including both the first and second adjacent television frequency channels. An output circuit is provided and is adapted to be connected to a turnstile antenna for providing to the antenna the combined television broadcast signals.

BRIEF DESCRIPTION OF THE DRAWINGS

The foregoing and other objects and advantages will become more readily apparent from the following description as taken in conjunction with the accompanying drawings wherein.

DESCRIPTION OF THE PREFERRED EMBODIMENT

Figure 1:
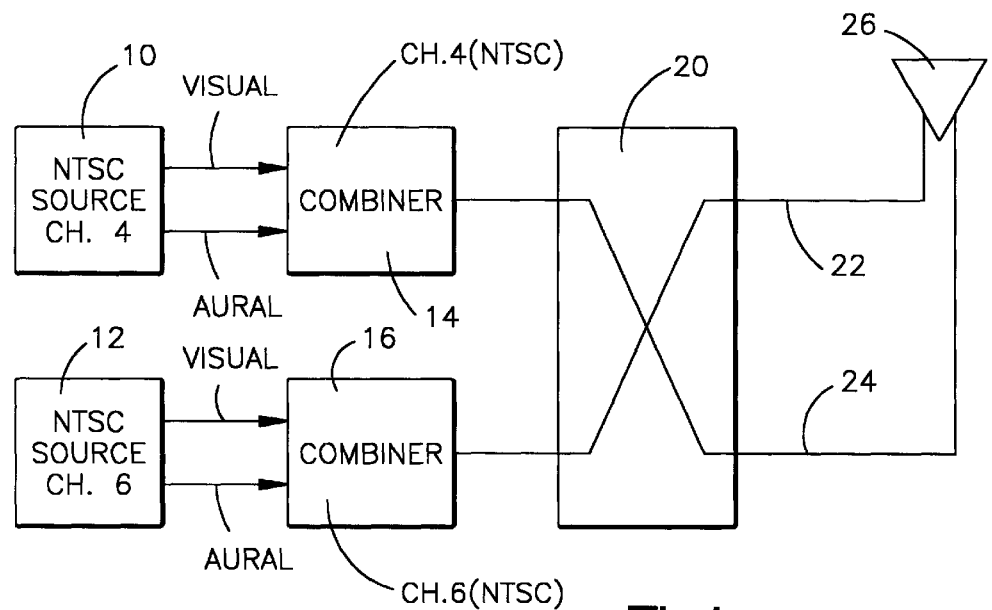
FIG. 1 is a schematic-block diagram illustration of a prior art system.

Before describing the preferred embodiments herein, reference is first made to FIG. 1 which illustrates a prior art system wherein the signals from two non-adjacent NTSC television channels have been combined and transmitted by means of a common antenna. This system is described on page 122 of an RCA catalog entitled *VHF TV Transmitting Equipment*, copyright 1968. Equipment as described there and as illustrated in FIG. 1 herein contemplates that two non-adjacent NTSC sources such as channel 4 at source 10 and channel 6 at source 12 supply both visual and aural signals to respective combiners 14 and 16. The combined signals which include both visual and aural components are supplied by combiners 14 and 16 to a 90° hybrid 20 which combines the twosignals with a 90° phase shift for application to two feedlines 22 and 24 which are connected to a two input common turnstile antenna 26. The two NTSC television channels are channel 4 (66 MHz to 72 MHz) and channel 6 (82 MHz to 88 MHz). In such a system the adjacent channels 3 and 5 are not assigned by the FCC.

Figure 2:
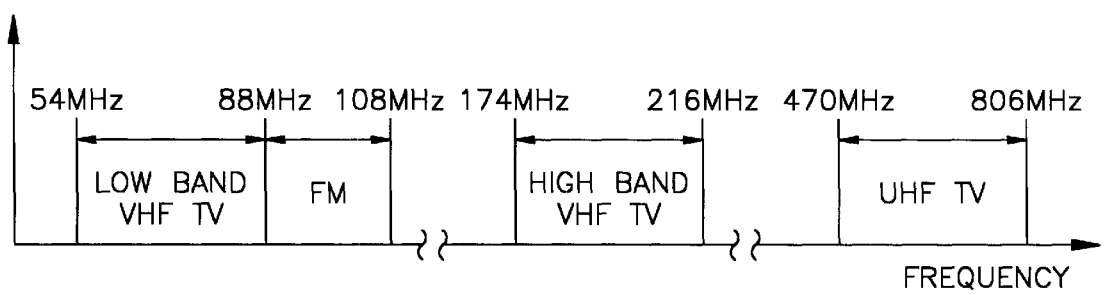
FIG. 2 is a graphical illustration of various frequency bands which may be helpful in understanding the present invention.

Reference is now made to FIG. 2 which illustrates various RF frequency bands including a low band VHF TV frequency band, from 54 MHz to 88 MHz. This is followed by an FM band from approximately 88 MHz to 108 MHz. The FM band is followed by ahighband VHF TV band which extends from 174 MHz to 216 MHz. The UHF TV band extends from 470 MHz to 806 MHz. The TV channels are each 6 MHz wide. This is illustrated in FIG. 3 with reference to the low band VHF TV frequency band described below.

Figure 3:
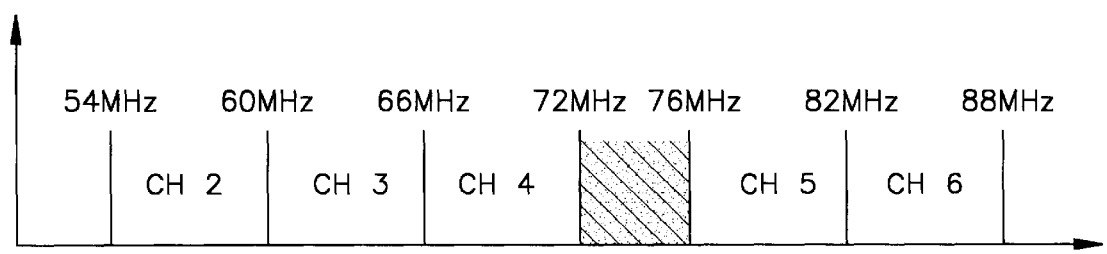
FIG. 3 is a graphical illustration of the low band VHF TV frequency band and which may be helpful in understandingithe present invention.

In FIG. 3 it is seen that channel 2 extends from 54 MHz to 60 MHz. Channels 3 and 4 are each 6 MHz wide. There is a space of approximately 4 MHz between channels 4 and 5 with channel 4 terminating at 72 MHz and channel 5 commencing at 76 MHz. Channel 6 follows channel 5 and extends from 82 MHz to 88 MHz. It is seen from the foregoing that channels 4 and 5 are not adjacent channels and, hence, both channels may be assigned to the same geographical area for NTSC broadcasting by the FCC. In the example presented in FIG. 1 the FCC has assigned non-adjacent channels 4 and 6 for NTSC broadcasting.

At present, the TV industry is in the process of introducing digital television (DTV) to the market. During a transition period (until the year 2006) the FCC is permitting various NTSC TV channels to have a second TV frequency band which will serve as a DTV channel. This presents a need to consider allowing a DTV channel to occupy a previously unassigned NTSC channel in the same geographical area. Additionally, it has been common to employ different antennas mounted on the same or different towers for transmitting television signals. The additional DTV channels may require either more antennas and towers and/or the use of common antennas.

Figure 4:
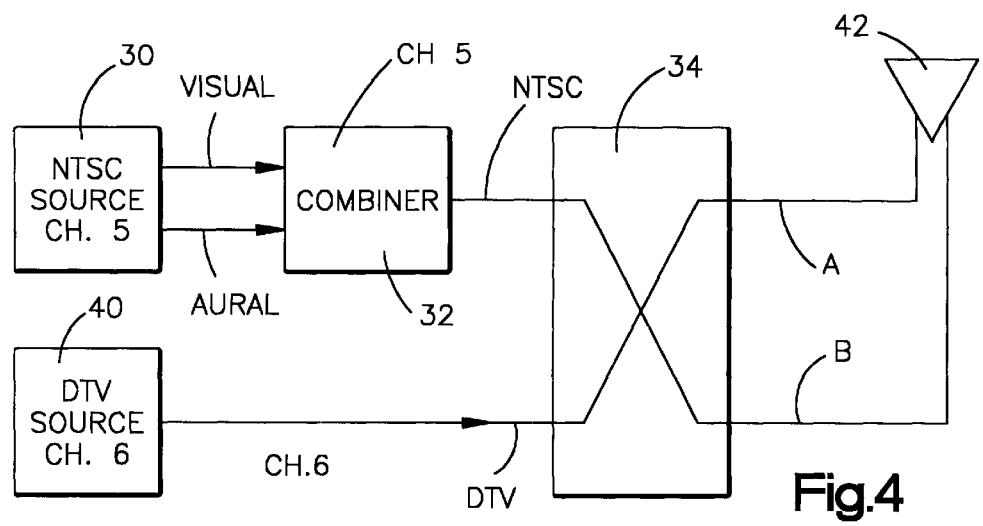
FIG. 4 is a schematic-block diagram illustration of one embodiment of the present invention.

The present invention contemplates that adjacent channels, at least one of which being a DTV channel, may have their signals combined and then applied to a common antenna for simultaneous broadcast. Reference is made to FIG. 4 which presents one embodiment of the present invention.

In FIG. 4 an NTSC source 30, for channel 5, is shown as having its visual and aural signals supplied to a combiner 32 which supplies a combined NTSC signal to one input of a 90° hybrid coupler 34. A DTV source 40, for channel 6, has its digital output signal supplied to a second input of the 90° hybrid coupler 34. The coupler 34, which may be constructed in the same manner as coupler 20, has two outputs A and B which are applied to antenna feedlines which supply a two input turnstile antenna 42. The output signals at outputs A and B of FIG. 4 include components of the NTSC and DTV inputs shifted by 90° in accordance with the equations set forth.

$$A = \frac{NTSC}{2} + \left(\frac{DTV}{2} + 90°\right) \qquad \text{Equation 1}$$

$$B = \left(\frac{NTSC}{2} + 90°\right) + \frac{DTV}{2} \qquad \text{Equation 2}$$

Figures 5A, 5B:
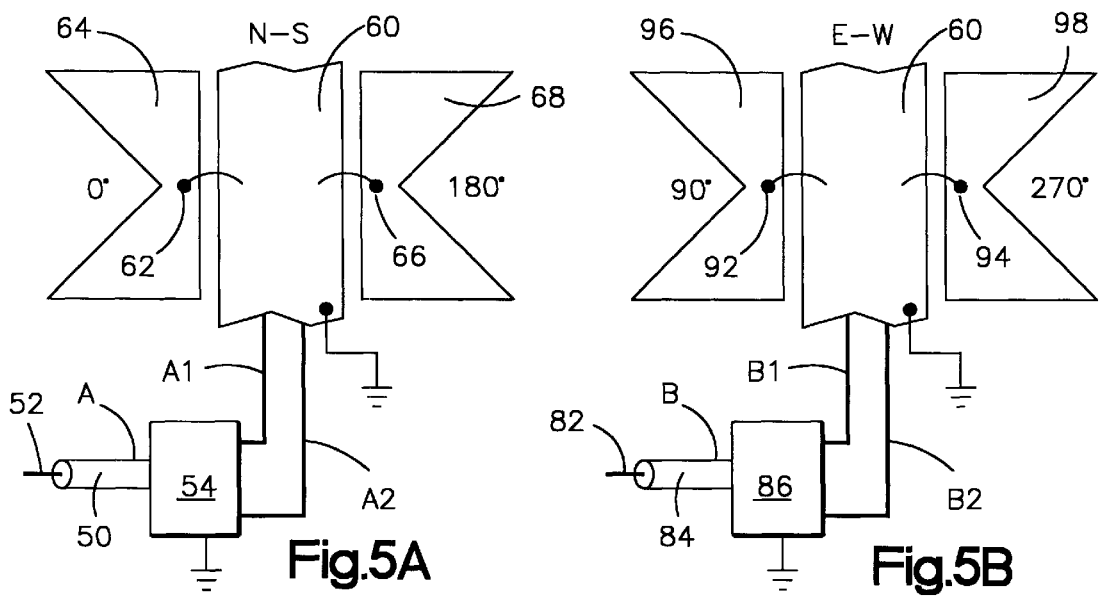
FIGS. 5a and 5b are schematic illustrations of a turnstile antenna which may be employed in practicing the present invention.

Reference is now made to FIGS. 5a and 5b which together represent the turnstile antenna 42 of FIG. 4. The A output of coupler 34 is a coaxial transmission line having an outer conductor 50 and an inner conductor 52. This is supplied to a suitable power splitter 54 which has an output connected to ground and a first output conductor A1 and a second output conductor A2 which carry signals that are displaced in phase by 180° with A1 being considered as 0° and A2 being considered as lagging by 180° that of A1. The conductor A1 is schematically illustrated as being applied through a hollow mast 60 and then connected to a terminal point 62 on a batwing antenna element 64. Conductor A2 is shown as extending through the hollow mast 60 and then being connected to a connector point 66 on a batwing element 68. If the mast 60 is made of metal then it is grounded and the conductors A1 and A2 extend through suitable insulators (not shown) to the connection points 62 and 66 on the batwing elements. These batwing elements may be supported by mast 60 as with suitable insulators (not shown). Batwing elements in FIG. 5a may be considered as the north-south (N-S) radiator elements and each may be constructed of a sheet of radiating material.

Reference is now made to FIG. 5b which represents the second pair of radiating elements for the same bay as that for the elements of FIG. 5a with the elements of FIG. 5b being located in aplane which is located 90° from that of the plane containing elements 64 and 68 of FIG. 5a. Otherwise, the construction is essentially identical. Output B of combiner 34 is a coaxial transmission line having an inner conductor 82 and an outer conductor 84 which are connected to a power splitter 86 having one output connected to ground and having a pair of output conductors B1 and B2. Conductor B1 provides an output which is phase displaced by 90° whereas output conductor B2 provides an output displaced by 270°. These are supplied through the same hollow mast 60 and, thence, to terminals 92 and 94 on the batwing elements 96 and 98 respectively.

Reference is now made to the radiation patterns in FIGS. 6–12 which are taken from testing apparatus constructed in accordance with that in FIGS. 4 and 5 for adjacent NTSC (channel 5) and DTV (channel 6) operation.

Figure 6:
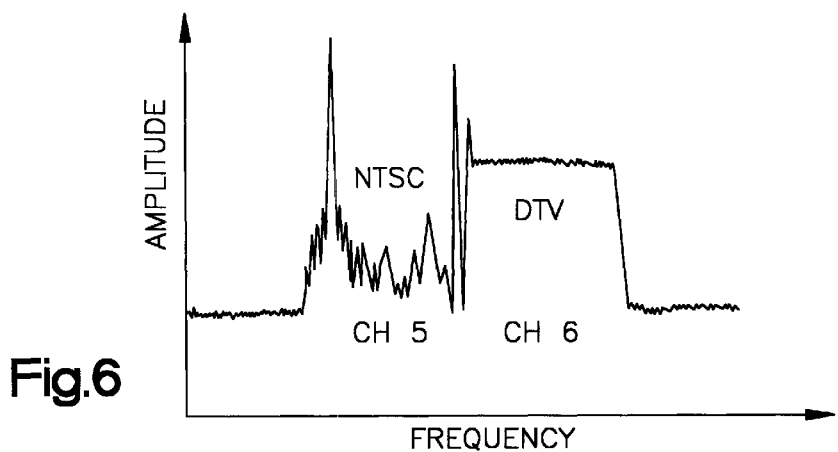
FIG. 6 is a graphical illustration of a plot of amplitude with respect to frequency showing the operation of two adjacent television channels including an NTSC channel and an adjacent DTV channel in accordance with the present invention.

FIG. 6 is a graphical illustration showing amplitude with respect to frequency of the NTSC and DTV frequency signals from channels 5 and 6. The center frequency for the NTSC signals is on the order of 79 MHz and that for the DTV-signals is on the order of 85 MHz.

Figure 7:
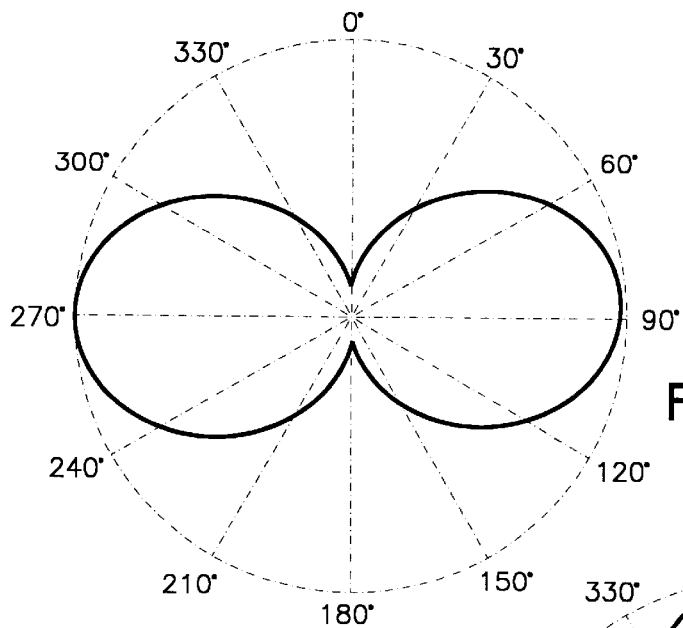
FIG. 7 is a peanut shaped radiation pattern by the north-south batwing radiating elements such as that illustrated in FIG. 5a at an operating frequency of 85 MHz.
Figure 8:
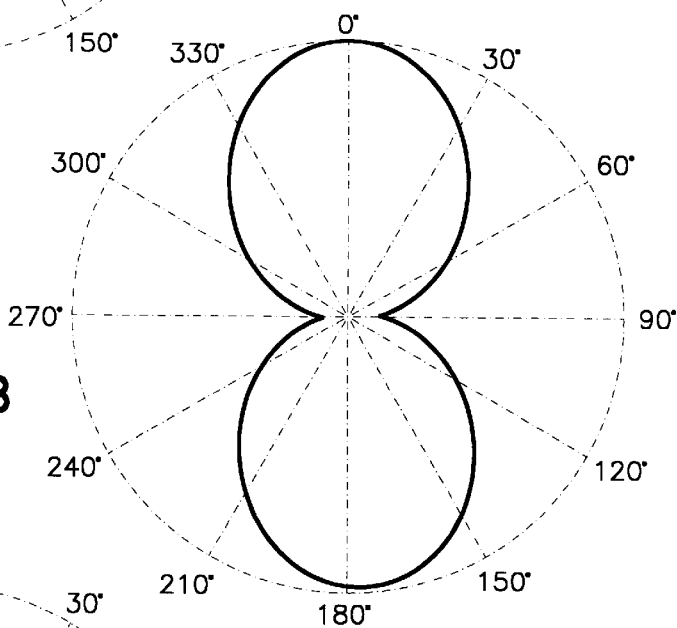
FIG. 8 is a peanut shaped radiation pattern by the east-west batwing radiating elements such as that in FIG. 5b at an operating frequency of 85 MHz.
Figure 9:
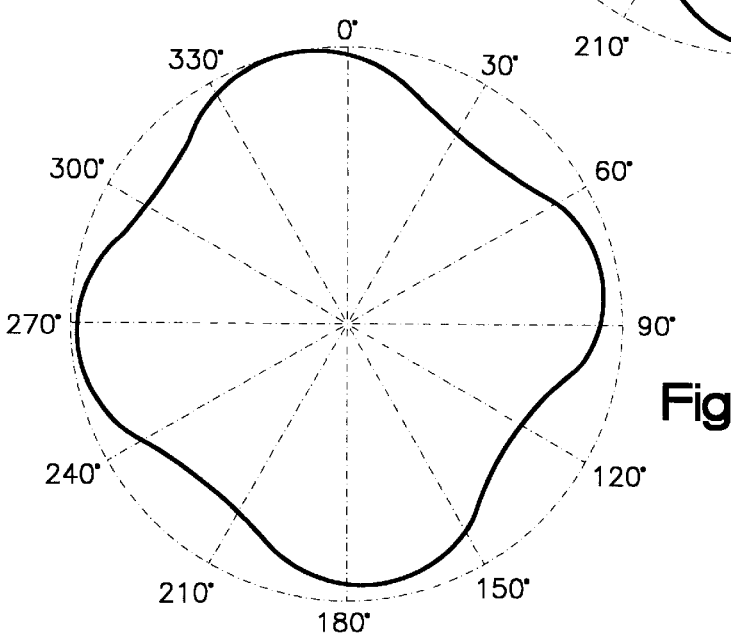
FIG. 9 is an omni-directional radiation pattern combining the patterns of FIGS. 7 and 8 noted above.

The DTV operation is illustrated by the radiation patterns in FIGS. 7, 8 and 9 wherein the peanut shaped radiation pattern in FIG. 7 represents the north-south pattern measured at a center frequency of 85 MHz. The east-west peanut shaped pattern of FIG. 8 for the DTV operation was taken at a center frequency of 85 MHZ. The combined omni-directional radiation pattern for the DTV operation (channel 6) at a center frequency of 85 MHz is illustrated in FIG. 9.

Figures 10, 11, 12:
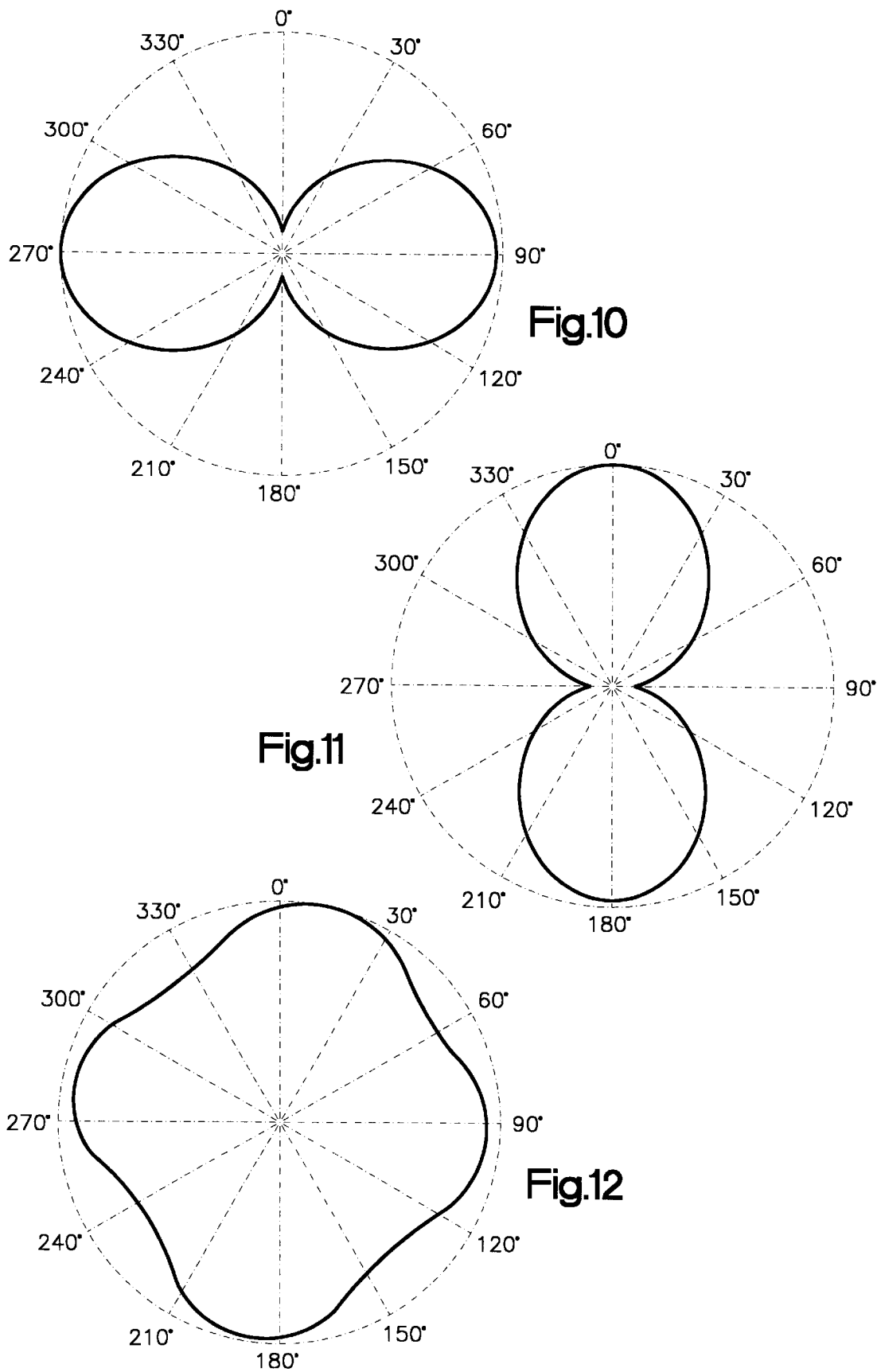
FIG. 10 is a peanut shaped pattern similar to that of FIG. 7 but for an operating frequency of 79 MHz (NTSC-channel 5)
FIG. 11 is a peanut shaped radiation pattern similar to that of FIG. 8 but for an operating frequency at 79 MHz (NTSC-channel 5)
FIG. 12 illustrates an omni-directional radiation pattern combining those of FIGS. 10 and 11 above.

The NTSC operation is illustrated in FIGS. 10, 11, and 12. The peanut-shaped radiation pattern in FIG. 10 is taken for NTSC (channel 5) operation taken at a center frequency of 79 MHz for the north-south radiation elements. The peanut-shaped radiation pattern in FIG. 11 is that for the east-west radiation elements and was taken at a center frequency of 79 MHz. The combined operation on both the east-west and the north-south radiation elements is illustrated as the omni-directional pattern in FIG. 12.

Figure 13:
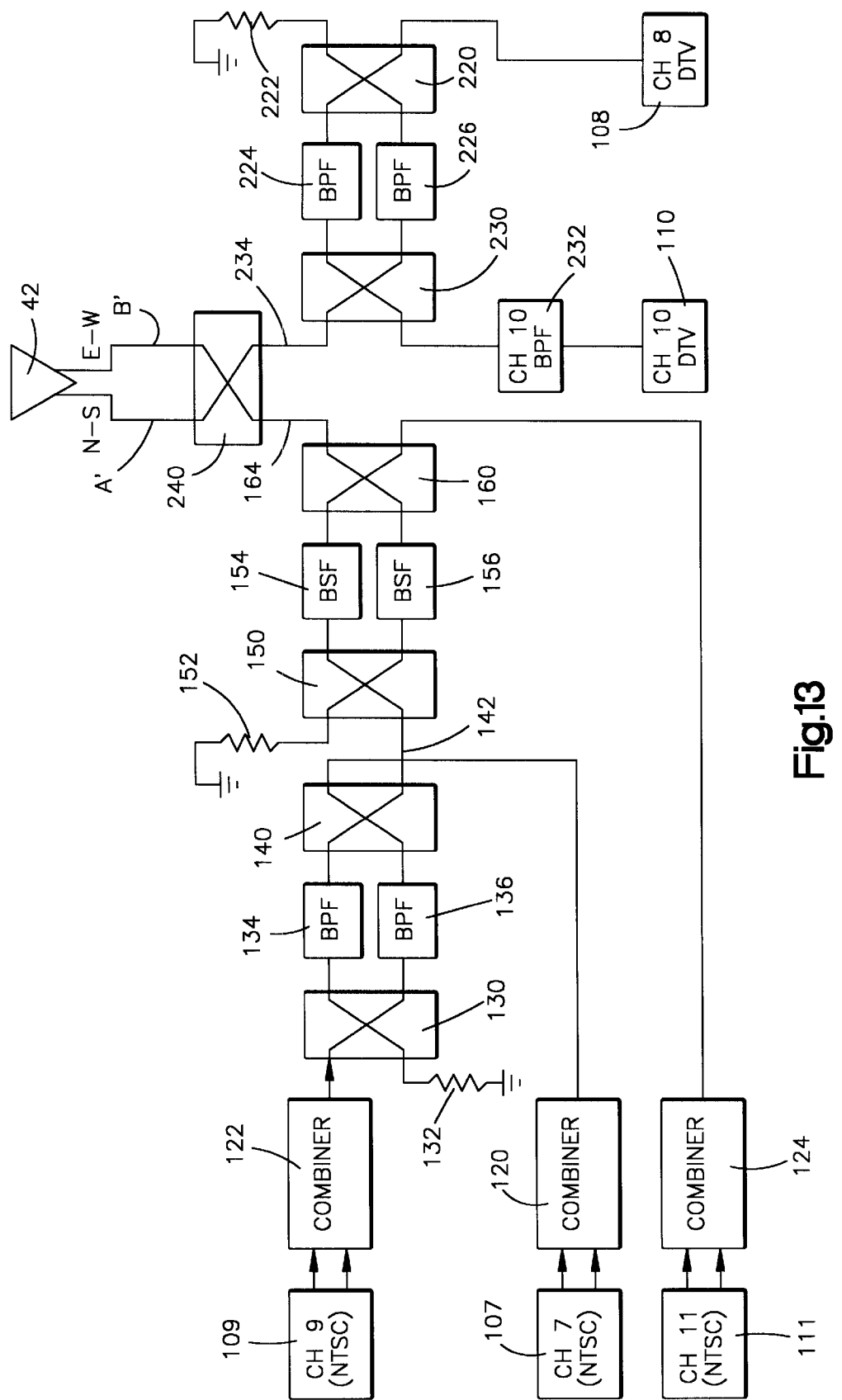
FIG. 13 is a schematic-block diagram illustration of a further embodiment of the present invention.

Reference is now made to FIG. 13 which illustrates another embodiment of the invention herein and which is based on that as illustrated in FIGS. 4–12. In this embodiment, three NTSC VHF channels are combined with two DTV VHF channels. The channels to be combined are NTSC channels 7, 9, and 11 and DTV channels 8 and 10. Each channel is transmitted with minimum response impairment because the NTSC channels are combined as an NTSC group first and then the DTV channels are combined as a DTV group and wherein there is one channel spacing between each of the NTSC channels and between the two DTV channels.

The two signal groups (the NTSC group and the DTV group) are then combined together in a single quadrature hybrid that feeds two separate antenna lines to a turnstile antenna having a pair of inputs. The turnstile antenna radiates both groups simultaneously but with counter rotating patterns on east-west (E-W) and north-south (N-S) radiator on a common turnstile antenna thereby providing overall omni-directional coverage for all combined channels.

A significant advantage of this structure is the feature of radiating six channels from the same antenna without increasing the aperture size or height. This is important for DTV operation on adjacent channels in order to maintain a 12 dB ratio between a parent NTSC station and the accompanying DTV station to avoid interference. The system provides a low cost, effective method to broadband combine a group of NTSC stations with interleaved (adjacent) DTV stations. The common turnstile antenna provides the necessary horizontal (H) and vertical (V) pattern matching for minimum received interference between NTSC and adjacent DTV stations.

The specific structure as set forth in FIG. 13 includes NTSC sources for channels 7, 9, and 11 as indicated by sources 107, 109 and 111 respectively. The DTV channels 8 and 10 are indicated by sources 108 and 110. The audio and video signals of channel 7 are combined with a combiner 120 to provide a combined, channel 7 signal. Similarly, the video and audio signals of the channel 9 source are combined with a combiner 122 to provide a combined channel 9 signal. Also the video and audio signals for channel 11 are combined with a combiner 124 to provide a combined channel 11 signal. The channel 9 signal is supplied to one input of a 90° hybrid coupler 130 having its second input connected to ground by way of a resistor 132. The outputs of coupler 130 are applied through channel 9 band pass filters 134 and 136 the outputs of which are applied to two inputs of a second 90° hybrid coupler 140. The channel 7 signal obtained from combiner 120 is supplied to the coupler 140 which then provides a single output signal representing the combinations of channels 7 and 9 at output 142. It is to be noted that the band pass filter 136 reflects the channel 7 signal and consequently the output 142 represents a full power combination of channels 7 and 9.

The combined channels 7 and 9 signal from output 142 is applied to one input of a 90° hybrid coupler 150 having its second input connected by way of a resistor 152 to ground. The outputs of coupler 150 are passed through band stop filters 154 and 156 to the two inputs of hybrid coupler 160. The hybrid coupler 160 also receives the channel 11 output signal from combiner 124. The band stop filters 154 and 156 reflect the channel 11 frequency signal so that at the output 164 of coupler 160 a full power combination is obtained of channels 7, 9, and 11.

The signals for the DTV channel 8 and DTV channel 10 sources-are also combined in FIG. 13. The signal from the DTV channel 8 source is supplied to one input of a 90° hybrid coupler 220 having its second input connected through a resistor 222 to ground. The outputs of coupler 220 are applied through a pair of band pass filters 224 and 226 which pass the frequency signals from the channel 8 source but reflect those from the channel 10 source. Signals passed through filters 224 and 226 are supplied to inputs of another 90° hybrid coupler 230. The frequency signals from the channel 10 DTV source 110 are supplied through a channel 10 band pass filter 232 and then to one input of the coupler 230. The single output of coupler 230 provides a combined signal of channels 8 and 10 at output 234. The NTSC output 164 and the DTV output 234 are then applied to another 90° hybrid coupler 240 having outputs A' and B'. The A' output is supplied to the north-south (N-S) radiating elements of a turnstile antenna 42 while the output B' is supplied to the east-west (E-W) radiating elements of the turnstile 42. The turnstile antenna 42 radiates both groups (the NTSC channels 7, 9, and 11 group and the DTV channels 8 and 10 group) simultaneously but with counter rotating patterns on the E-W and the N-S radiator elements (see FIGS. 5A and 5B) providing overall omni-directional coverage for all combined channels. It is to be noted that the combined signals at outputs A' and B' include components of all of the channels in accordance with the equations set forth below:

$$A' = \frac{1}{2}(CH7 + CH9 + CH11) + \frac{1}{2}(CH8 + CH10)@90° \quad \text{Equation 3}$$

$$B' = \frac{1}{2}(CH8 + CH10) + \frac{1}{2}(CH7 + CH9 + CH11)@90° \quad \text{Equation 4}$$

The common turnstile antenna provides the necessary horizontal (H) and vertical (V) pattern matching for minimum received interference between NTSC and adjacent DTV stations.

From the foregoing description of the invention, those skilled in the art will perceive improvements, changes and modifications. Such improvement, changes and modifications within the skill of the art are intended to be covered by the appended claims.

Having described the invention, the following is claimed:

1. Apparatus for transmitting television signals from adjacent channels with a common antenna comprising:
   a source of first television signals from a first channel selected from a first frequency band including a plurality of channels;
   a source of second television signals from a second channel in said first frequency band and wherein said second channel is adjacent to said first channel;
   means for combining said first and second signals to provide a first combined signal and a second combined signal;
   common antenna means for receiving said first and second combined signals and transmitting television signals; and
   wherein said means for combining includes a hybrid combiner.

2. An apparatus as set forth in claim 1 wherein said hybrid combiner is a 90° hybrid combiner which combines said first and second signals in such a manner that said first combined signal includes a portion of said first signal and a phase displaced portion of said second signal and that said second combined signal includes a portion of said second signal and a phase displaced portion of said first signal.

3. An apparatus as set forth in claim 2 wherein each said phase displaced portion is phase displaced by 90°.

4. An apparatus as set forth in claim 2 wherein said antenna means includes a turnstile antenna having a first pair of antenna elements and a second pair of antenna elements.

5. An apparatus as set forth in claim 4 including first means for applying said first combined signal to said first pair of antenna elements and second means for applying said second combined signal to said second pair of antenna elements.

6. Apparatus for transmitting television signals from adjacent channels with a common antenna comprising:
   a source of first television signals from a first channel selected from a first frequency band including a plurality of channels;
   a source of second television signals from a second channel in said first frequency band and wherein said second channel is adjacent to said first channel;
   means for combining said first and second signals to provide a first combined signal and a second combined signal;
   common antenna means for receiving said first and second combined signals and transmitting television signals; and
   wherein said first frequency band is a low VHF TV frequency band from approximately 54 MHz to 88 MHz.

7. Apparatus for transmitting television signals from adjacent channels with a common antenna comprising:
   a source of first television signals from a first channel selected from a first frequency band including a plurality of channels;
   a source of second television signals from a second channel in said first frequency band and wherein said second channel is adjacent to said first channel;
   means for combining said first and second signals to provide a first combined signal and a second combined signal;
   common antenna means for receiving said first and second combined signals and transmitting television signals; and
   wherein said first frequency band is a high band VHF TV frequency band from approximately 174 MHz to 216 MHz.

8. Apparatus for transmitting television signals from adjacent channels with a common antenna comprising:
   a source of first television signals from a first channel selected from a first frequency band including a plurality of channels;
   a source of second television signals from a second channel insaid first frequency band andwherein said second channel is adjacent to said first channel;
   means for combining said first and second signals to provide a first combined signal and a second combined signal;
   common antenna means for receiving said first and second combined signals and transmitting television signals; and
   wherein said first frequency band is a UHF TV frequency band from approximately 470 MHZ to 806 MHZ.

9. Apparatus for transmitting television signals from adjacent channels with a common antenna comprising:
   a source of first television signals from a first channel selected from a first frequency band including a plurality of channels;
   a source of second television signals from a second channel in said first frequency band and wherein said second channel is adjacent to said first channel;
   means for combining said first and second signals to provide a first combined signal and a second combined signal;
   common antenna means for receiving said first and second combined signals and transmitting television signals; and
   wherein said first channel is an analog signal channel and said second channel is a digital signal channel.

10. A system for combined digital and analog television transmissions from a common antenna comprising:
    an analog television signal transmission source;
    a digital television signal transmission source;
    a combining means for combining the analog television signal and the digital television signal and providing first and second combined signals each being phase shifted by 90°; and
    a common turnstile antenna having first and second inputs for receiving said first and second combined signals for transmitting television signals.

11. A method of transmitting combined digital and analog television signals from a common antenna comprising the steps of:
    providing a digital television feed and an analog television feed to a combining means;
    combining the digital and the analog television feeds into first and second combined signal at said combining means with each having a 90° phase shift; and
    transporting the combined signals to two input common antenna means for radiating the combined signals.

12. The method of claim 11 wherein said common antenna means is a turnstile antenna.

13. A radio frequency coupler for simultaneously coupling television signals from at least two television broadcast transmitters to a single turnstile type antenna, wherein the transmitters are adapted to transit television signals at adjacent standard television frequency channels, the coupler comprising:

a first input circuit for receiving television broadcast signals at a first television frequency channel from a first broadcast transmitter;

a second input circuit for receiving television broadcast signals at a second television frequency channel from a second broadcast transmitter, the second television frequency channel being located in the broadcast television frequency spectrum adjacent to the first television frequency channel;

a combiner circuit connected to simultaneously receive the television broadcast signals at both the first and second television frequency channels from the first and second input circuits for providing combined television broadcast signals comprised of both the first and second adjacent television frequency channels, and an output circuit adapted to be connected to the turnstile antenna for providing thereto the combined television broadcast signals.

14. A combination of a television broadcast radio frequency coupler and a turnstile type antenna for simultaneously receiving television signals from first and second television broadcast transmitters adapted to provide first and second separate radio frequency television signals at frequencies of adjacent channels in the broadcast television frequency spectrum, for simultaneously transmitting the adjacent channels with the single turnstile antenna, the combination comprising:

a turnstile type antenna for receiving television broadcast signals and broadcasting the television signals, the antenna being capable of broadcasting televisionsignals over a frequency range including at least adjacent television channels;

a coupler circuit for simultaneously receiving the television broadcast signals from the first and second television broadcast transmitters for providing combined television broadcast signals comprised of both the first and second adjacent television frequency channels, and a coupling circuit for coupling the coupler circuit to the turnstile type antenna for providing the combined television broadcast signals to the antenna for the simultaneous broadcast thereof.

15. Apparatus for transmitting television signals from adjacent channels with a common antenna comprising:

a source of first television signals from a first channel selected from a first frequency band including a plurality of channels;

a source of second television signals from a second channel in said first frequency band and wherein said second channel is adjacent to said first channel;

a combiner that combines said first and second signals to provide a first combined signal and a second combined signal;

a common antenna that receives said first and second combined signals and transmits television signals; and wherein said combiner includes a hybrid combiner.

16. An apparatus as set forth in claim 15 wherein said hybrid combiner is a 90° hybrid combiner which combines said first and second signals in such a manner that said first combined signal includes a portion of said first signal and a phase displaced portion of said second signal and that said second combined signal includes a portion of said second signal and a phase displaced portion of said first signal.

17. An apparatus as set forth in claim 16 wherein each said phase displaced portion is phase displaced by 90°.

18. An apparatus as set forth in claim 16 wherein said antenna includes a turnstile antenna having a first pair of antenna elements and a second pair of antenna elements.

19. An apparatus as set forth in claim 18 including a first circuit that applies said first combined signal to said first pair of antenna elements and a second circuit that applies said second combined signal to said second pair of antenna elements.

20. Apparatus for transmitting television signals from adjacent channels with a common antenna comprising:

a source of first television signals from a first channel selected from a first frequency band including a plurality of channels;

a source of second television signals from a second channel in said first frequency band and wherein said second channel is adjacent to said first channel;

a combiner that combines said first and second signals to provide a first combined signal and a second combined signal;

a common antenna that receives said first and second combined signals and transmits television signals; and wherein said first frequency band is a low band VHF TV frequency band from approximately 54 MHz to 88 MHz.

21. Apparatus for transmitting television signals from adjacent channels with a common antenna comprising:

a source of first television signals from a first channel selected from a first frequency band including a plurality of channels;

a source of second television signals from a second channel in said first frequency band and wherein said second channel is adjacent to said first channel;

a combiner that combines said first and second signals to provide a first combined signal and a second combined signal;

a common antenna that receives said first and second combined signals and transmits television signals; and wherein said first frequency band is a high band VHF TV frequency band from approximately 174 MHz to 216 MHz.

22. Apparatus for transmitting television signals from adjacent channels with a common antenna comprising:

a source of first television signals from a first channel selected from a first frequency band including a plurality of channels;

a source of second television signals from a second channel in said first frequency band and wherein said second channel is adjacent to said first channel;

a combiner that combines said first and second signals to provide a first combined signal and a second combined signal;

a common antenna that receives said first and second combined signals and transmits television signals; and wherein said first frequency band is a UHF TV frequency band from approximately 470 MHz to 806 MHz.

23. Apparatus for transmitting television signals from adjacent channels with a common antenna comprising:

a source of first television signals from a first channel selected from a first frequency band including a plurality of channels;

a source of second television signals from a second channel in said first frequency band and wherein said second channel is adjacent to said first channel;

a combiner that combines said first and second signals to provide a first combined signal and a second combined signal;

a common antenna that receives said first and second combined signals and transmits television signals; and wherein said first channel is an analog signal channel and said second channel is a digital signal channel.

24. A system for combined digital and analog television transmissions from a common antenna comprising:

an analog television signal transmission source;

a digital television signal transmission source;

a combiner that combines the analog television signal and the digital television signal and providing first and second combined signals each being phase shifted by 90°; and a common turnstile antenna having first and second inputs for receiving said first and second combined signals for transmitting television signals.

\* \* \* \* \*